Jan. 11, 1955 R. R. SCOVILLE Re. 23,921

VACUUM TUBE SOCKET TERMINAL STRUCTURE

Original Filed May 18, 1946 2 Sheets-Sheet 1

Inventor

Ray R. Scoville

By Lyon & Lyon

Attorneys

VACUUM TUBE SOCKET TERMINAL STRUCTURE

Original Filed May 18, 1946 2 Sheets-Sheet 2

Inventor
Ray R. Scoville
By Lyon & Lyon
Attorneys

United States Patent Office

Re. 23,921
Reissued Jan. 11, 1955

23,921

VACUUM TUBE SOCKET TERMINAL STRUCTURE

Ray R. Scoville, Los Angeles, Calif.

Original No. 2,604,584, dated July 22, 1952, Serial No. 670,682, May 18, 1946. Application for reissue April 29, 1954, Serial No. 426,624

23 Claims. (Cl. 339—198)

Matter enclosed in heavy brackets [ ] appears in the original patent but forms no part of this reissue specification; matter printed in italics indicates the additions made by reissue.

My invention relates to electronic tube socket terminal structures; that is, to a means which forms a unitary part of an electronic tube socket and on or around which may be mounted the various resistors, condensers, inductors, transformers, or other circuit components, particularly those which are closely related to the electronic tube which fits the tube socket. The objects of my invention include:

First, to provide a structure of this character which reduces to a minimum the length of leads between socket terminals and the circuit components, thus reducing stray wiring capacitance which might otherwise have a detrimental effect on the electronic circuit involved, particularly at high frequencies.

Second, to provide a structure of this character wherein the various resistors, condensers, inductors, and other components associated with the terminals of a given vacuum tube socket form a unitary sub-assembly which may be readily installed or removed and which requires a minimum of electrical connection with other such sub-assemblies to produce a complete electronic device, thereby providing a structure which materially simplifies the manufacture of electronic devices as well as the servicing thereof.

Third, to provide a structure of this character which minimizes the electrostatic capacity or coupling between various components mounted thereon without sacrificing the advantages of compact assembly.

Fourth, to provide an electronic tube socket terminal structure which is adaptable to the various otherwise standard tube sockets including the midget type.

With the above and other objects in view as may appear hereinafter, reference is directed to the accompanying drawings, in which.

Figure 1:
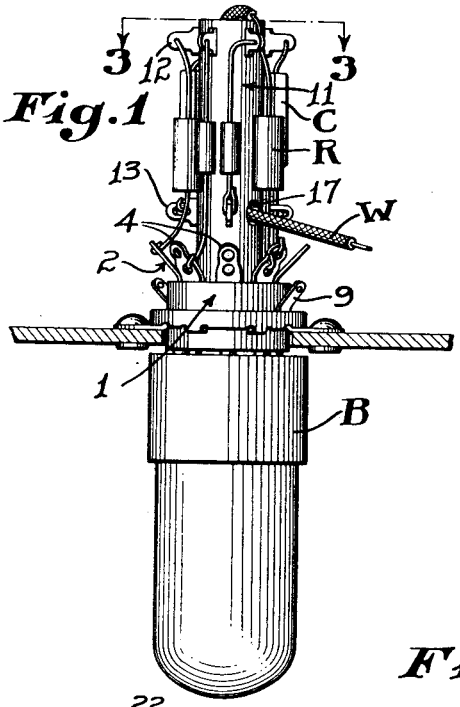
Figure 1 is an elevational view of my terminal structure incorporating a tube socket and showing an electronic tube mounted therein, and also showing various circuit components secured in place, the entire assembly being shown in its inverted position; that is, the position occupied during assembly and servicing of the electronic apparatus involving the assembly.

Reference is first directed to Figures 1 to 4 inclusive. In this construction a tube socket body 1 is provided having a ring of openings which receive metallic socket elements terminating in terminal elements 2. The inner end of each terminal element is in the form of a socket, whereas the other end thereof forms a tongue or lug 4 protruding from the back side of the body 1.

The body 1 is provided with a flange 5 and is fastened to a chassis frame 6 by a mounting collar 7 and rivets 8. The mounting collar 7 may include ground lugs 9. The tube socket body 1 is provided with a central bore 10.

The tube socket body 1 is designed to receive either a particular type of vacuum tube or any other type of electronic tube. For purposes of illustration one type of tube is shown; such tube comprises a base B, and a ring of pins P which make electrical contact with the socket elements 3 which extend beyond block 1, thus forming terminal elements 2. While not true of all types of tubes, the tube illustrated is provided with a key stem which fits the central bore 10. The bore and the key stem are provided with a mating rib and groove so that the tube may be readily oriented.

The structure so far described is conventional. My invention, while including the socket as an element thereof, is directed primarily to a mounting means which projects from the back side of the socket body. More specifically, in the illustrated examples of my invention, said mounting means is in the form of a mounting tube 11 of insulating material which is secured to the back side of the body in coaxial relation with the bore 10. The socket body may be modified by the provision of a counterbore enlarging the central bore 10 at the back side of the body. The mounting tube 11 is fitted into such counterbore and cemented therein. Alternatively, of course, the mounting means may be integral with the tube socket body 1.

Figure 2:
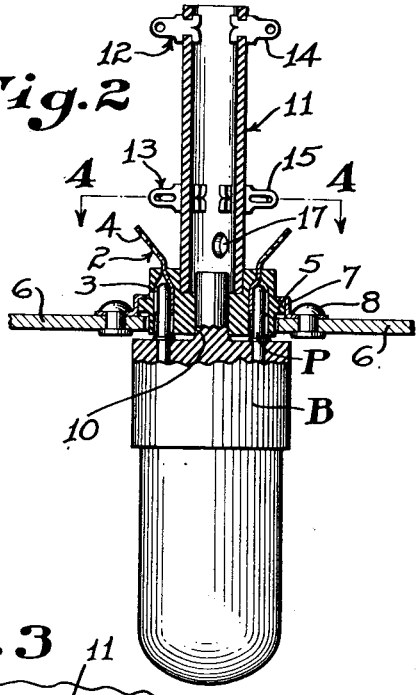
Figure 2 is a longitudinal sectional view thereof with the circuit components omitted and the tube partly in elevation.
Figure 3:
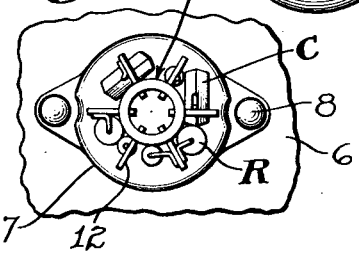
Figure 3 is an end view thereof taken from the line 3—3 of Figure 1.
Figure 5:
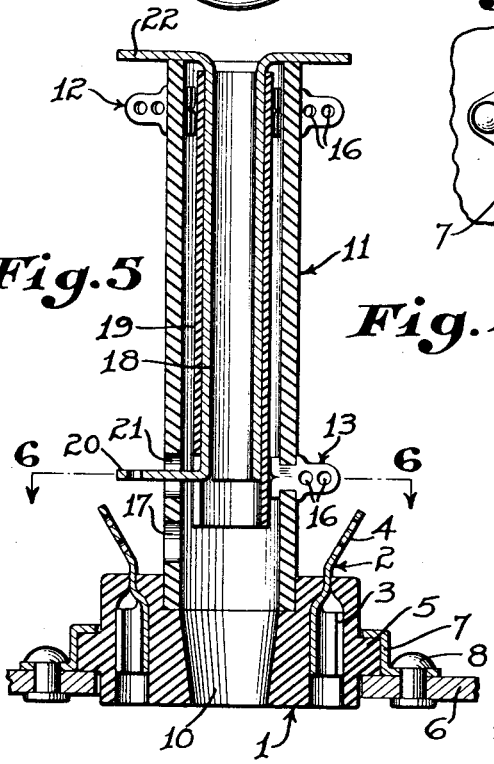
Figure 5 is an enlarged longitudinal sectional view of a modified form of the tube socket terminal structure in which an electrostatic shield is provided within the structure.
Figure 4:
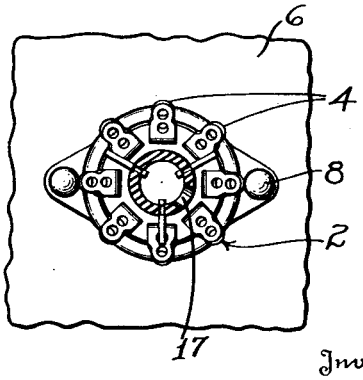
Figure 4 is a transverse sectional view thereof taken through 4—4 of Figure 2.

Radiating from the mounting post or tube 11 are sets of radially positioned terminals which may take the form of soldering lugs or mounting lugs 12 and 13. Such terminals may be placed wherever desired on the mounting post but preferably the axes of the members of each set define a common plane traversing the mounting post. One set is disposed adjacent the extremity of the mounting post and the other near its base end. Each lug is preferably in the form of a short strap of metal stamped to provide a hole 14 or a slot 15 as shown in Figure 2 or a pair of holes 16 as shown in Figure 5 through which the mounting wires of various circuit components may be inserted. Each lug is provided with opposed shoulders which abut the surface of the mounting tube and the inner extremities are split and bent away from each other so as to rivet the lug securely in place. The lugs are preferably radially mounted with their surfaces parallel to the axis of the mounting tube in order to provide maximum spacing between the lugs thereby to reduce electrostatic coupling.

The mounting tube 11 may have one or more side openings 17 near its base end adapted to receive a lead wire W which may extend upwardly within the mounting tube, over the top thereof, and join to one of the mounting lugs. One or more wires may be brought through an opening 17 or several such openings may be provided.

The sets of soldering lugs 12 and 13 are adapted to support resistors R, condensors C, and other circuit components. Some of these components may be connected between the soldering lugs 4 of the tube socket body 1 and the member of the extended set of soldering lugs 12, bypassing the lugs 13.

In fact in some instances the base set 13 of soldering lugs may be omitted.

Figure 6:
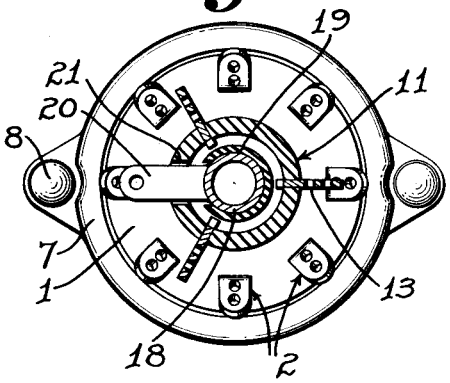
Figure 6 is a transverse sectional view thereof through 6—6 of Figure 5.

In some instances it is desirable to interpose a shield within the mounting tube 11 in order to minimize coupling effects between the various circuit components, and in this regard reference is directed to Figures 5 and 6. In this view in shown a metallic shield tube 18 surrounded by an insulating sleeve 19. The shield tube 18 is provided with an inner lug 20 adapted to be brought outwardly through a side opening 21. If desired the shield 18 shown in Fig. 5, may occupy all or part of the tube 11. The extended end of the shield tube 18 is provided with one or more radiating lugs 22 which overlie the upper end of the mounting tube 11. The insulating sleeve 19 protects the shield tube 18 against electrical contact with the riveted inner ends of the soldering lugs 12 and 13.

Figure 8:
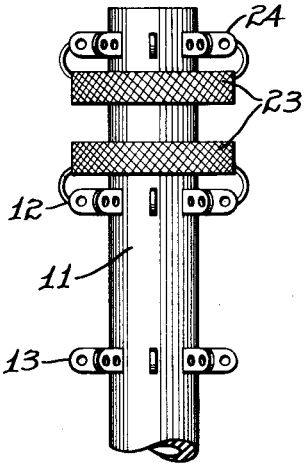
Figure 8 is a fragmentary elevational view of a further modified form of my invention wherein inductance coils or interstage transformers are mounted thereon.

As shown in Figure 8, the mounting tube 11 may be extended to support additional circuit components such as inductance coils 23 or interstage transformers or the like, and may also be provided with a third set of terminal lugs 24.

Figure 7:
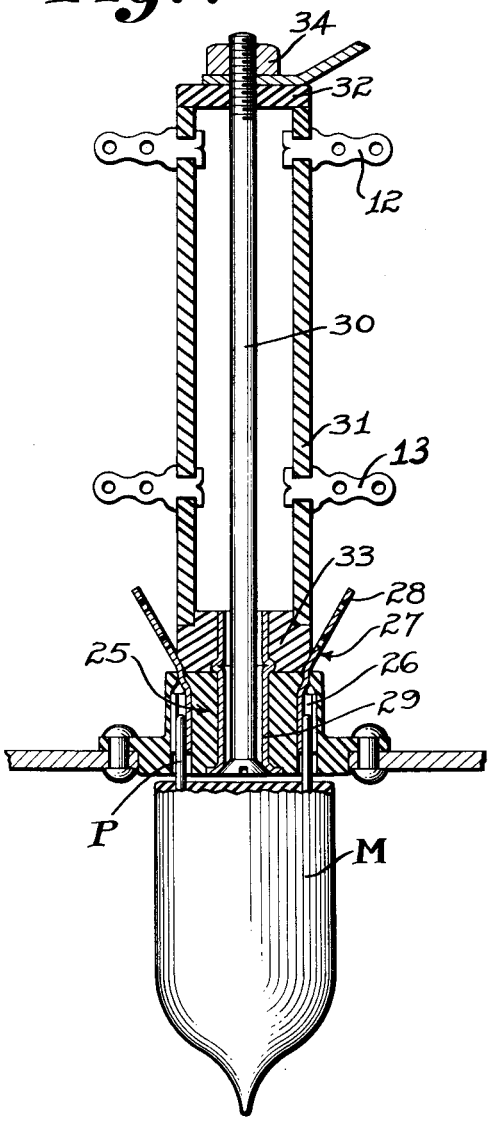
Figure 7 is a similar enlarged longitudinal sectional view of a modified form of my socket terminal structure adapted for use with a midget or minature type of socket and showing a midget or minature type of tube therein.

The structure so far described is shown as related to a standard size electronic tube. My invention, however, has equal application to the midget or miniature vacuum tubes, particularly in that such tubes are used primarily in high frequency applications where the problems of inductive and capacitive effects are particularly troublesome. Reference is therefore directed to Figure 7.

The conventional miniature socket 25 is provided with a ring of openings which receive the socket members 26 with terminal elements 27. The terminal elements 27 protrude from the back side of the socket body to form soldering lugs 28. The socket members 26 receive the pins P of a miniature tube M. The miniature socket is adapted to be mounted in the conventional manner on a chassis. At least one type of miniature socket body is provided with a central bore which receives a liner 29. The liner serves as a rivet to hold the parts of the socket together. The liner 29 is utilized to receive a tie bolt 30 which extends from the front side of the socket body through a mounting tube 31 of insulating material. The mounting tube is provided with end pieces 32 and 33. The end piece 33 fits around the extended inner end of the liner 29 within the ring of soldering lugs 28. The end piece 32 covers the mounting tube 31 and supports a nut 34 into which the tie bolt 30 extends. The mounting tube 31 may be provided with the various mounting lug arrangements shown in the other figures of the drawings. By grounding the bolt 30 through a lug, mounted under nut 34, a shielding effect is obtained as between elements mounted on opposite sides of tube 31.

It will be observed that the socket body with its mounting tube may serve to support all or most of the circuit components related to the tube for which the socket is intended, and thus by mounting the various components on the mounting tube the entire structure becomes a convenient sub-assembly which may be readily and quickly installed or removed. Furthermore, each of the components are readily accessible for repair or change. It will also be observed that the particular mounting arrangement which my structure provides minimizes the electrostatic capacity between the representative resistors, conductors, inductors, or other components. Still further, it is clear that in those instances where space is at a premium my structure is particularly applicable.

Having fully described my invention it is to be understood that I do not wish to be limited to the details herein set forth, but my invention is of the full scope of the appended claims.

I claim:

1. A mounting means for connecting leads and circuit components to the elements of an electronic tube, comprising a socket for said tube, said socket having a plurality of socket terminals at least in part parallel to the axis of said socket, a tubular mounting post of insulating material extending from one side of said socket, said electronic tube engaging and extending from the opposite side of said socket, a first plurality of post terminals whose axes are radially disposed in a first plane perpendicular to the longitudinal axis of said post, a second plurality of post terminals whose axes are radially disposed in a second plane perpendicular to the longitudinal axis of said post, said first and second planes being displaced from each other along said post by a distance allowing convenient mounting of some of said components between said first and second post terminals and some of said components between said post terminals and said socket terminals, and a hollow metallic shield mounted within said tubular post, said tubular post and said hollow shield being provided with openings for running some of the connecting leads through said hollow shield, whereby said circuit components are shields from each other and from said leads by said shield.

2. A mounting means for connecting leads and circuit components to the elements of an electronic tube, comprising a socket for said tube, said socket having a plurality of socket terminals at least in part parallel to the axis of said socket, a tubular mounting post of insulating material extending from one side of said socket, said electronic tube engaging and extending from the opposite side of said socket, a first plurality of post terminals whose axes are radially disposed in a first plane perpendicular to the longitudinal axis of said post, a second plurality of post terminals whose axes are radially disposed in a second plane perpendicular to the longitudinal axis of said post, said first and second planes being displaced from each other along said post by a distance allowing convenient mounting of some of said components between said first and second post terminals and some of said components between said post terminals and said socket terminals, and a coil wound around said post, said coil constituting a part of said components.

3. A mounting means for circuit components comprising an insulating block, a plurality of metallic elements circularly disposed within said block, a mounting post carried by said block and extending therefrom in a direction away from one side of said block and from within the area of said one side defined by said metallic elements, a first set of terminals circumferentially positioned around the outer end of said post, and at least one additional set of terminals circumferentially positioned around said post between said metallic elements and said first set of terminals, whereby said metallic elements and said first and second terminals furnish means for connecting and mounting said circuit components.

4. In a mounting means for circuit components associated with the elements of an electronic tube having a plurality of parallel prongs, the combination of: an electronic tube holder comprising an insulating block, a plurality of metallic socket elements mounted within said block for receiving said prongs and for mounting said tube on one side of said block, said socket elements terminating in a corresponding plurality of first set of terminals projecting beyond the other side of said block, the locus of said first set of terminals defining a first circle, a post carried by said block and extending therefrom in a direction away from said other side and from within the area on said other side defined by said socket elements, said post being coaxial with said block, whereby said socket elements surround said post; a second set of terminals radially positioned around the outer end of said post, the outer ends of said second set of terminals defining a second circle having a diameter at least equal to the diameter of said first circle, and at least a third set of terminals radially positioned around said post between said first and second sets of terminals, the outer ends of said third set of terminals defining a third circle having a diameter at least equal to the diameter of said first and second circles, whereby said circuit components are capable of being mounted in the space intervening between said first, second and third sets of terminals without spacial interference between said circuit components.

5. A mounting means for circuit components associated with the elements of an electronic tube having a plurality of parallel prongs, said mounting means including an electronic tube holder comprising an insulating block, a plurality of metallic socket elements mounted within said block for receiving said prongs and for mounting said tube on one side of said block, said elements having a corresponding plurality of terminals projecting beyond the other side of said block and constituting a first set of terminals; a post carried by and rigidly attached to said block and extending therefrom in a direction away from said other side and from within the area on said second side defined by said first set of terminals, whereby said terminals surround said post; a second set of terminals circumferentially positioned around said post, said second set of terminals being insulated from each other and from said first set of terminals whereby said circuit components may be connected and mounted in the space intervening between said first and second sets of terminals without spacial interference.

6. A mounting as defined in claim 5 which also includes at least one additional set of terminals circumferentially positioned around said post, the terminals of said additional set being insulated from each other and from said first and second sets of terminals.

7. In a mounting means for circuit components associated with the elements of an electronic tube, the combination of: a multiple terminal socket for an electronic tube; a tubular mounting post of insulating material extending from the side of said socket opposite from said tube; a lateral opening substantially at the socket end of said post; a plurality of supporting terminals secured in the walls of and radiating from said post to carry, at least in part, circuit components electrically connected with said socket; and a metallic member within said post, said member, when grounded, forming at least a partial electrostatic shield between the circuit components surrounding said post.

8. In a mounting means for circuit components associated with the elements of a vacuum tube, the combination of: a tube holder for receiving a vacuum tube on one side of said holder, said tube holder having socket elements with terminals extending in ring form from the other side of said holder; a tubular mounting post of insulating material connected to said other side of said holder and extending from within the ring defined by said terminals, a plurality of supporting terminals secured in the walls of and radiating from said post for supporting circuit components, at least some of said circuit components being electrically connected with said terminals on said tube holder, and a metallic member within said post, said member, when grounded, forming at least a partial electrostatic shield between the circuit components surrounding said post.

9. In a mounting means for circuit components adapted to be connected to elements of an electronic tube, the combination of: a tube holder having socket elements for receiving said tube on one side of said holder, said socket elements having terminals extending in ring form from the other side of said holder; a mounting tube of insulating material connected to said holder and extending from within the ring defined by said terminals, said mounting tube having at least one lateral opening near its attached end through which a lead wire may be threaded and protruded from the extremity of said mounting tube; a first set of terminals at substantially the outer end of said mounting tube, a second set of terminals adjacent to the attached end of said post, said first and second sets of terminals and the terminals of said socket elements coacting to provide facilities adapted to support in axially disposed relation about said mounting tube a plurality of said circuit components; and a metallic member within said mounting tube to form at least a partial electrostatic shield between the circuit components surrounding said mounting tube when said member is connected to an electrical reference point for said circuit components.

10. In a mounting means for circuit components associated with the elements of an electronic tube having parallel prongs, the combination of: a post of insulating material having a radially enlarged head at one end, a ring of parallel socket elements within said head for receiving said prongs, said elements terminating in a ring of lugs disposed around the base of said post and around the juncture between said post and said head, and axially spaced sets of terminals mounted on said post for mounting said circuit components along the exterior of said post.

11. A mounting means for circuit components associated with the elements of an electronic tube having parallel prongs, including a tube holder comprising a block of insulating material having inner and outer faces and dimensioned to fill an opening in a metallic base plate with said outer face, metallic socket members mounted in said block for receiving said prongs, said members having terminals extending in ring form beyond said inner face, a cylindrical seat at the inner face of said block of smaller diameter than the diameter of said ring, a hollow cylindrical mounting post of insulating material engaging said seat, said post extending away from said inner face, and a plurality of flat radially directed metallic terminal fins, having bifurcated bases, clinched to said mounting post, the flat surfaces of said fins being in planes which include the longitudinal axis of said post.

12. A mounting means for circuit components associated with the elements of an electronic tube having parallel prongs, including a tube holder comprising a block of insulating material having inner and outer faces and dimensioned to fill an opening in a metallic base plate with said outer face, metallic socket members mounted in said block for receiving said prongs, said members having terminals extending in ring form outwardly from said inner face, a cylindrical seat at the inner face of said block of smaller diameter than the diameter of said ring, a hollow cylindrical mounting post of insulating material engaging said seat, said post extending away from said inner face, and radial metallic terminals clinched to the wall of said post, said terminals being capable of carrying circuit components longitudinally along the exterior of said post.

13. A mounting means as defined in claim 12, in which said seat comprises an annular recess in said block.

14. A mounting means as defined in claim 12, in which said seat comprises a cylindrical boss extending beyond said inner face.

15. An electronic circuit device element for mounting a vacuum tube and related circuit components, comprising in combination with a vacuum tube socket of the type typified by the octal base socket adapted at one side to receive the prongs of a vacuum tube and having terminal lugs projecting from the opposite side thereof, a terminal post of insulating material and of tubular construction mounted on said socket projecting axially from the terminal lug side thereof, and a plurality of connecting members mounted, separately insulated, directly on the outer side wall of said terminal post to project outwardly from such wall in positions spaced axially from said socket terminal lugs, near the end of said post remote from said socket.

16. An electronic circuit subassembly component, comprising a terminal post of insulating material, a flange of insulating material on the base of said post, projecting a substantial distance radially outward therefrom and the end wall thereof opposite said terminal post being formed as a vacuum tube socket, socket terminal connectors mounted, separately insulated, in the end wall of said flange adjacent to said terminal post and distributed around the base of said post, and separate connectors individually mounted directly upon said insulating terminal post at locations spaced longitudinally of said post from said socket terminal connectors.

17. An electronic circuit subassembly component as defined in claim 16 in which said connnectors are located in a plane which is substantially parallel to said flange, and intermediate the ends of said post, and additional connectors mounted directly upon said insulating terminal post at positions more removed from the base of the post than the positions of the first-named connectors.

18. A mounting means for circuit components associated with elements of an electronic tube having a plurality of parallel prongs, said mounting means including an electronic tube holder comprising an insulating member, a plurality of metallic socket elements mounted within said member for receiving said prongs and for mounting said tube on one side of said member, said socket elements having a corresponding plurality of terminals projecting beyond the other side of said member and constituting a first set of terminals, a second set of terminals located beyond said other side of said member, a third set of terminals positioned further from said member than the second set of terminals, and a structure for maintaining the terminals of the first, second and third sets in predetermined fixed and insulative relation with each other comprising rigid means mechanically connected to said electronic tube holder and to second and third sets of terminals and including insulating means separating the several terminals of the second set from each other and from those of the third set as well as including insulating means separating the several terminals of the second set from each other and from those of the third set as well as including insulating means separating the terminals of the third set from each other.

19. A mounting means for circuit components associated with elements of an electronic tube having a plurality of parallel prongs, said mounting means including an electronic tube holder comprising an insulating member, a plurality of metallic socket elements mounted within said member for receiving said prongs and for mounting said tube on one side of said member, said socket elements having a corresponding plurality of terminals projecting beyond the other side of said member and constituting a first set of terminals, a second set of terminals located beyond said other side of said member, a third set of terminals positioned further from said member than the second set of terminals, insulating means supporting said second and third sets of terminals, each of said terminals in said second and third sets being insulated from each other, and a structure for maintaining the terminals of the first, second and third sets in a predetermined fixed and insulating relation with each other comprising means mechanically connected to said electronic tube holder and to said insulating means.

20. A mounting means for circuit components associated with elements of an electronic device having a plurality of terminals; said mounting means including an electronic device holder comprising an insulating member; a first plurality of metallic terminals, mounted on said insulating member in insulated relationship with respect to each other, for connecting said device to said first terminals; said first terminals being disposed around the axis of said insulating member; a second set of terminals disposed around said axis but spaced along said axis in the same direction but further removed from said electronic device than the first set of terminals, insulating support means for said second set of terminals, said second set of terminals being mounted on said insulating support means in insulated relationship with respect to each other, and a structure for maintaining said first and second terminals in spaced and insulative relationship with respect to each other, said structure including a post interconnecting said insulating member and said insulating support, the longitudinal axis of said post coinciding with the axis of said insulating member.

*21. A mounting means for circuit components associated with elements of an electronic tube having a plurality of parallel prongs, said mounting means including an electronic tube holder comprising an insulating member, a plurality of metallic socket elements mounted within said member for receiving said prongs and for mounting said tube on one side of said member, said socket elements having a corresponding plurality of terminals projecting away from said member, a plurality of metallic lugs located in substantially a common plane displaced away from the other side of the tube holder with the lugs positioned at different angular positions with reference to that center line of the tube holder which extends parallel to said prongs when they are inserted in the insulating member, a second plurality of metallic lugs substantially in a common plane displaced away from said other side of the tube holder with the lugs positioned at different angular positions with reference to said center line, the second-named plane being substantially parallel to the first and farther from the tube holder than the first-named plane, each of said lugs defining an opening into which wires may be placed and soldered, and means carried by the tube holder rigidly carrying all of said lugs at their respective positions and insulating some of them from others.*

*22. A mounting means for circuit components associated with elements of an electronic tube having a plurality of parallel prongs, said mounting means including an electronic tube holder comprising an insulating member, a plurality of metallic socket elements mounted within said member for receiving said prongs and for mounting said tube on one side of said member, said socket elements having a corresponding plurality of terminals projecting beyond the other side of said member and constituting a first set of terminals, a second set of terminals located beyond said other side of said member, a third set of terminals positioned further from said member than the second set of terminals, insulating means rigidly supporting said second and third sets of terminals, some of said terminals in said second and third sets being insulated from each other, and a structure for rigidly securing said insulating means to said electronic tube holder, said terminals being in the form of lugs having openings whereby wires may be soldered therein.*

*23. A mounting means for circuit components associated with the elements of an electronic tube having a plurality of parallel prongs, said mounting means including an electronic tube holder comprising an insulating block, a plurality of metallic socket elements mounted within said block for receiving said prongs and for mounting said tube on one side of said block, said elements having a corresponding plurality of terminals projecting beyond the other side of said block and constituting a first set of terminals; a post carried by and rigidly attached to said block and extending along the center line of the tube holder in a direction away from said other side and from within the area on said second side defined by said first set of terminals, whereby said terminals surround said post; a second set of terminals circumferentially positioned around said center line, some of said terminals of said second set being insulated from each other and from the terminals of the first set; a third set of terminals positioned around said center line and farther away from said other side than the second set of terminals; and means mechanically connecting the terminals of the second and third sets to said post to form a unitary structure having three sets of terminals in three substantially parallel planes progressively removed from said other side of said insulating block.*

References Cited in the file of this patent or the original patent

UNITED STATES PATENTS

| | | |
|---|---|---|
| 1,656,009 | McMullin | Jan. 10, 1928 |
| 1,965,202 | Roys | July 3, 1934 |
| 2,088,355 | Wehming | July 27, 1937 |
| 2,111,381 | Barton | Mar. 15, 1938 |
| 2,186,184 | Tubbs | Jan. 9, 1940 |
| 2,268,619 | Reid | Jan. 6, 1942 |
| 2,323,628 | Smith | July 6, 1943 |
| 2,369,177 | Raskhodoff | Feb. 13, 1945 |
| 2,377,893 | Lorenzen | June 12, 1945 |
| 2,436,756 | Larkin | Feb. 24, 1948 |
| 2,553,287 | Yates | May 15, 1951 |

FOREIGN PATENTS

| | | |
|---|---|---|
| 634,033 | France | Oct. 31, 1927 |
| 807,990 | France | Oct. 26, 1936 |